United States Patent [19]

Guzik

[11] 4,371,912
[45] Feb. 1, 1983

[54] METHOD OF MOUNTING INTERRELATED COMPONENTS

[75] Inventor: Andrzej T. Guzik, Ft. Lauderdale, Fla.

[73] Assignee: Motorola, Inc., Schaumburg, Ill.

[21] Appl. No.: 192,771

[22] Filed: Oct. 1, 1980

[51] Int. Cl.³ .......................... H05K 3/34; H05K 1/18
[52] U.S. Cl. ..................................... 361/417; 29/840; 228/180 A; 357/75; 361/400
[58] Field of Search ................. 29/729, 825, 832, 834, 29/836, 840; 174/52 FP; 339/17 B, 17 M, 17 LM; 357/69, 70, 75; 361/386, 388, 395, 400, 401, 403, 412, 414, 417, 418, 397; 228/179, 180 A

[56] References Cited

U.S. PATENT DOCUMENTS

| | | |
|---|---|---|
| 3,395,318 | 7/1968 | Laermer et al. ................. 361/386 X |
| 3,465,415 | 9/1969 | Walls . |
| 3,483,308 | 12/1969 | Wakely ........................... 361/403 X |
| 3,593,064 | 7/1971 | Wagner .......................... 361/394 X |
| 3,646,399 | 2/1972 | Mars et al. ...................... 29/834 X |
| 3,689,684 | 9/1972 | Cox, Jr. et al. . |
| 3,805,117 | 4/1974 | Hausman ........................ 361/400 X |
| 3,835,531 | 9/1971 | Luttmer . |
| 3,916,434 | 10/1975 | Garboushian . |
| 4,003,125 | 1/1977 | Wallick . |
| 4,047,780 | 9/1977 | Cedrone . |
| 4,084,315 | 4/1978 | Michaels . |
| 4,095,334 | 6/1978 | Uchida . |
| 4,167,647 | 9/1979 | Salera . |
| 4,177,554 | 12/1979 | Deveres et al. . |
| 4,288,841 | 9/1981 | Gogal ................................ 361/414 |
| 4,289,922 | 9/1981 | Devlin . |

FOREIGN PATENT DOCUMENTS 1446305 6/1966 France ............................. 361/401

OTHER PUBLICATIONS

"High-Density Packaging Goes Denser with QUIPs and Square-Chip Carriers", Morris Grossman, Electronic Design 6, 3/15/79.
Innovations in Hybrid Packaging, by H. Markstein in Electronic Packaging & Production, Sep. 1979, pp. 41-44.

Primary Examiner—Francis S. Husar
Assistant Examiner—Carl J. Arbes
Attorney, Agent, or Firm—Joseph T. Downey; Edward M. Roney; James W. Gillman

[57] ABSTRACT

One specially designed fixture allows two components such as a microprocessor and its associated ROM to be simultaneously mounted on opposite surfaces of the substrate, with all or nearly all internal connections made through the area of the substrate between the components. A second fixture allows for wave soldering lead frames to the assembly while protecting the reflow soldered components. The method thus provides the most direct connections between the two components with all internal connections and external connections made by two automatic operations. A third component can be positioned astraddle the mounted assembly for minimum lead lengths.

14 Claims, 7 Drawing Figures

METHOD OF MOUNTING INTERRELATED COMPONENTS

BACKGROUND OF THE INVENTION

This invention relates to the field of mounting two or three electronic components such as leadless chip carriers containing integrated circuit chips in the space of one and, more particularly, to a method of mounting a primary component and auxiliary components with minimal lead lengths and minimal substrate area.

Chip carriers as used for mounting IC's are typically small ceramic boxes in which a chip is fastened, as by an epoxy, and contacts are made between the chip and the carrier by wire bonds which are made individually by a manual operation. In a co-pending application which is commonly assigned, U.S. Ser. No. 192,590, filed Oct. 1, 1980, in the name of Gatto, et al, entitled Dual Electronic Component Assembly, a substrate has a chip epoxied to each side with external connections made by wire bonds to one set of pads and the very short interconnections are made by wire bonds to separate pads which are coupled together by vias through the substrate. While the interconnects in this arrangement are relatively short, for some circuitry even these may be too long and space on the substrate may be wasted. Also, the wire bonding process normally requires manual attachment of each end of each bond, an exacting and time consuming process.

SUMMARY OF THE INVENTION

It is therefore an object of the present invention to provide a dual mounting of components on a substrate requiring no manual processes.

It is another particular object to provide a dual mounting requiring minimum substrate area.

It is a particular object to add another related component still providing interconnections of minimum length.

These object and others which will become apparent are provided in accordance with the invention by the pattern of conductors on the substrate, by the design of the two soldering fixtures and the position of the additional component. In the first fixture, the substrate and the two electronic components are retained and positioned, and the assembly is subjected to a temperature suitable for reflow soldering. Since all of the connections to the auxiliary component, such as a ROM, are made to the primary component, such as a microprocessor, all or most of the connections between the two components are made using through-holes in the substrate between the components. The assembly is removed from the first fixture and lead frames are then mechanically attached to the edges of the substrate. The assembly is then inserted in another fixture which encloses and protects the components while the edges of the unit are exposed to fluxing and wave soldering processes.

DETAILED DESCRIPTION OF A PREFERRED EMBODIMENT

Figure 1:
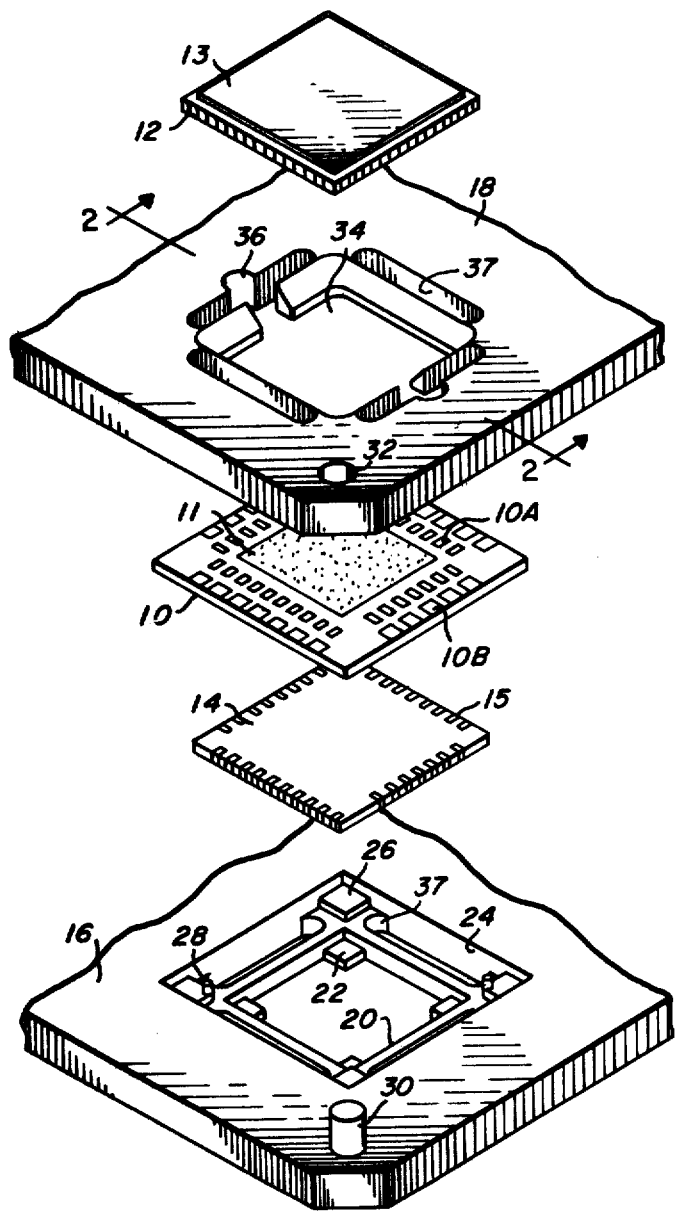
FIG. 1 is an exploded view of the assembly with the portions of the first soldering fixture.

In FIG. 1 may be seen a substrate 10 with conductive areas 10A and 10B, and a central insulation film 11, the film covering conductive areas 10C (see details in FIG. 6). A microprocessor 12 is shown with a sealing plate 13 substantially overlying, a ROM 14 which is shown with conductive portions 15. The microprocessor will, of course, have conductive portions on the unseen side and the ROM will have a sealing plate also. These three elements will be joined or fused by means of a reflow solder process by the use of a fixture including a bottom portion 16 and top portion 18. The fixture portions may be formed of any suitable material such as aluminum having the appropriate heat sink characteristic. The bottom portion 16 includes a bottomless recess 20 and supporting posts 22. The ROM 14 is accurately positioned in the cavity 20 on the posts 22. Above the recess 20 is a second recess 24, including supporting posts 26 and alignment pins 28 for supporting and positioning the substrate 10 on the ROM 14. Also on the bottom portion 16 are two alignment posts 30 (one shown). The top portion 18 of the fixture includes two apertures 32 (one shown) for mating with the posts 30, and a central aperture 34 for receiving and positioning the microprocessor 12. Recesses 36 in the walls of the aperture 34 allow for ease of insertion of the microprocessor 12.

Figure 2:
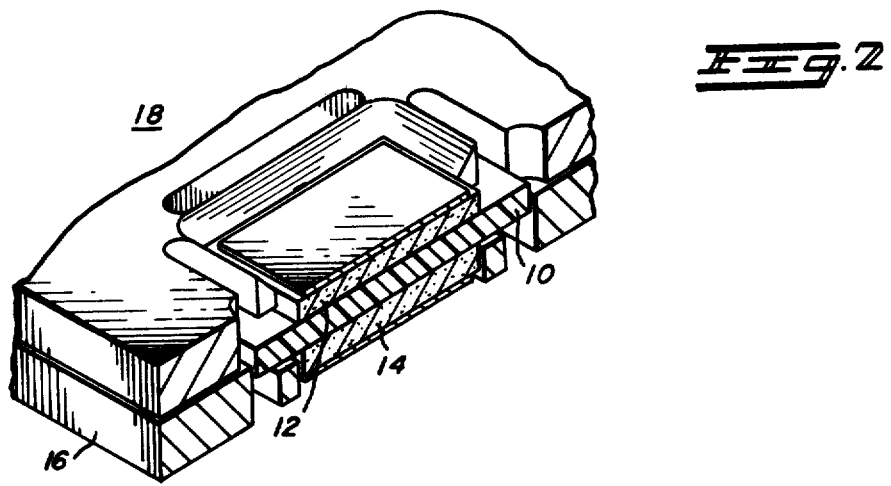
FIG. 2 is a cut-away perspective view of the combined elements of FIG. 1.

FIG. 2 is a cut-away view of the elements of FIG. 1 along the line 2—2 as indicated on the top portion 18 of the first fixture. As assembled in FIG. 2, the entire structure is exposed to air at a temperature sufficiently high to produce the reflow solder process, since the areas 10A (FIG. 1) will preferably have received a screened-on solder paste as in known in the art. Apertures 37 (see FIG. 1) in the portion 16 and the portion 18 allow hot air to flow freely to the assembly. Following the heating step, the fixture portions 16 and 18 are removed and the soldered assembly is cooled.

Figure 3:
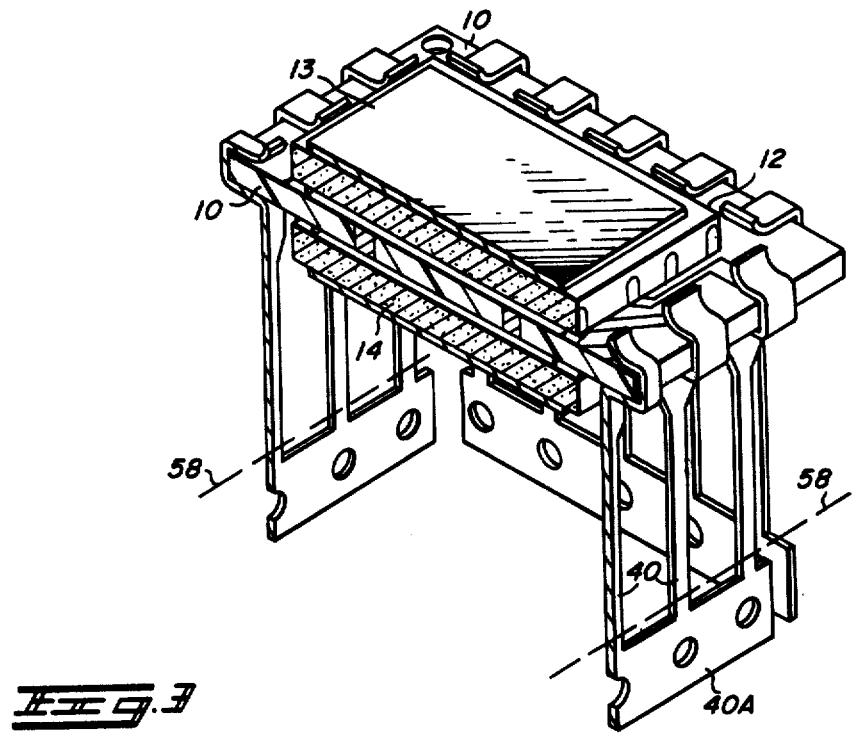
FIG. 3 is a cut-away perspective view of the assembly as prepared for the second soldering step.

In FIG. 3, the reflow soldered assembly is seen in cut-away form with lead frames 40 attached. As is known in the art, such leads are most expeditiously handled when the ends are connected by easily separated strips 40A (one shown). Leads are therefore stamped out, formed, and attached to conductive areas 10B (FIG. 1) on the substrate 10 while so connected. The top connecting strip 40A (not shown) has already been snapped off as seen in FIG. 3, leaving the bottom strip 40A for strength and ease of handling until after the next solder step is completed. As may be seen, the areas 10B on one surface are preferably connected through vias to opposing areas on the other surface, thus the leads 40 have a doubled electrical connection.

Figure 4:
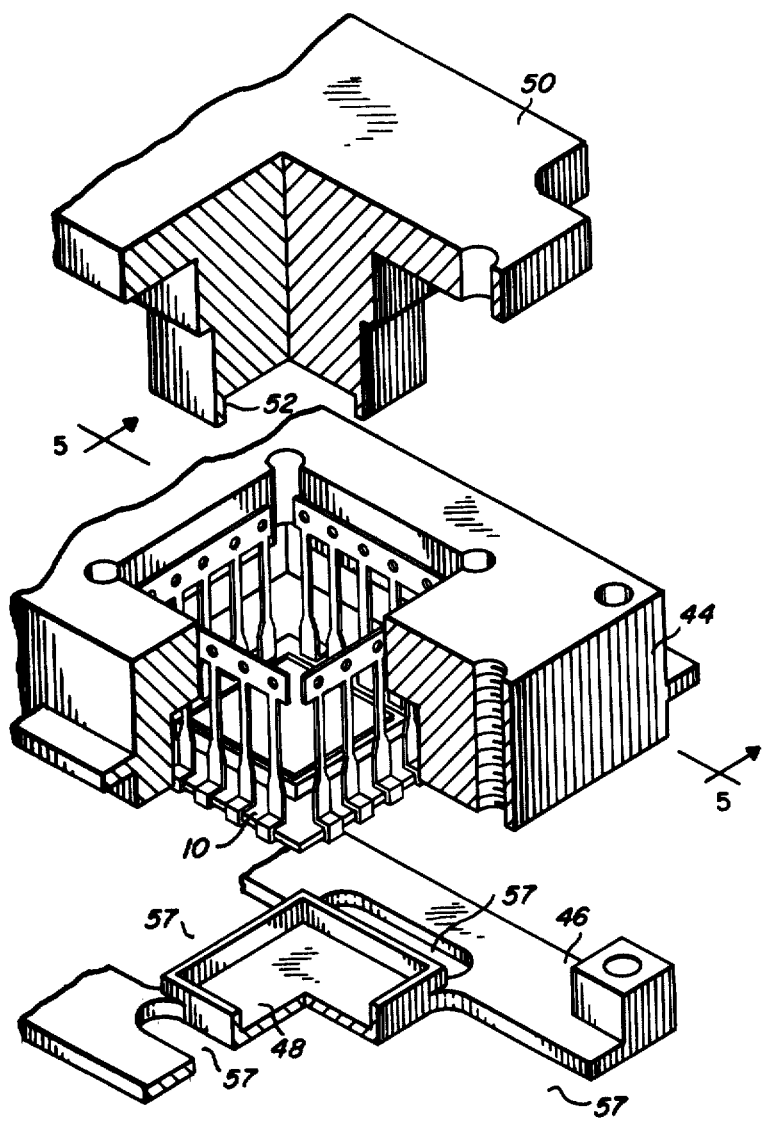
FIG. 4 is a partially cut-away, exploded view of the assembly of FIG. 3 and the second soldering fixture.

FIG. 4 illustrates the second fixture as used for soldering the leads 40 to the substrate conductive areas 10B. The second fixture preferably consists of three sections, a central section 44 which surrounds the assembly of FIG. 3 and retains a bottom section 46 having a recess 48 for receiving the central portion of the lower side of the substrate 10, and a top section 50 having a recess 52 for enclosing the central portion of the upper side of the substrate.

Figure 5:
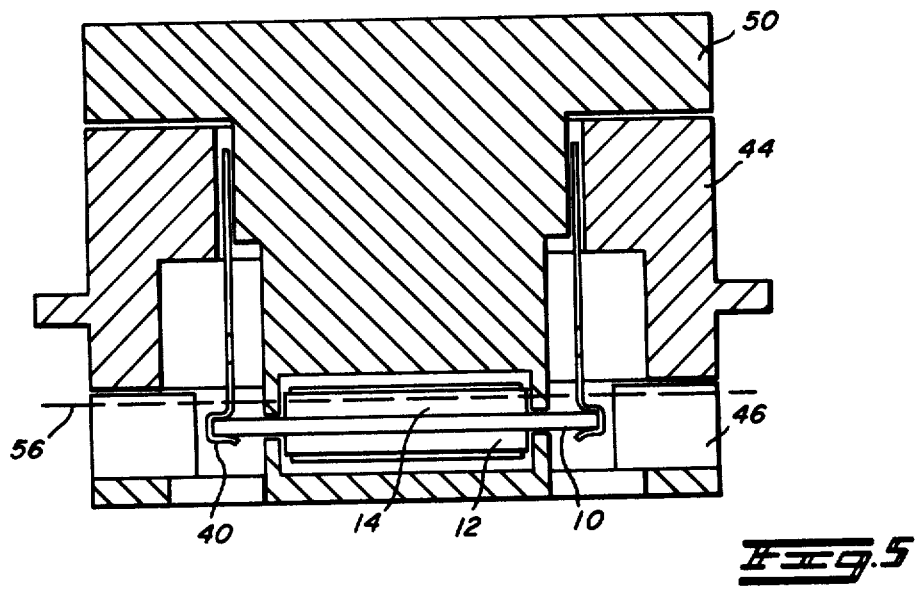
FIG. 5 is a cut-away view of the assembly of FIG. 4.

In FIG. 5, the same fixture sections are seen in a cut-away view which includes a dashed line 56 indicating the level of the solder in the wave soldering process. Solder can reach the lead/substrate junctions by way of apertures 57 in the fixture portion 46 as well as entering between portions 46, 44. It can be clearly seen in this figure that the components which have already been reflow soldered to the substrate are protected from exposure to the molten solder and that the fixture, by its volume, also provides heat sinking to protect those components. After the wave solder step, and before the assembly is tested and mounted on a PC board (not shown) or other supporting means, the strip 40A will be cut off along a line indicated by the dashed line 58 (see FIG. 3). At this point, the assembly can be electrically tested. If any component proves defective, it can easily be removed using standard reflow service techniques well known in the thick film hybrid circuit industry.

Figure 6A:
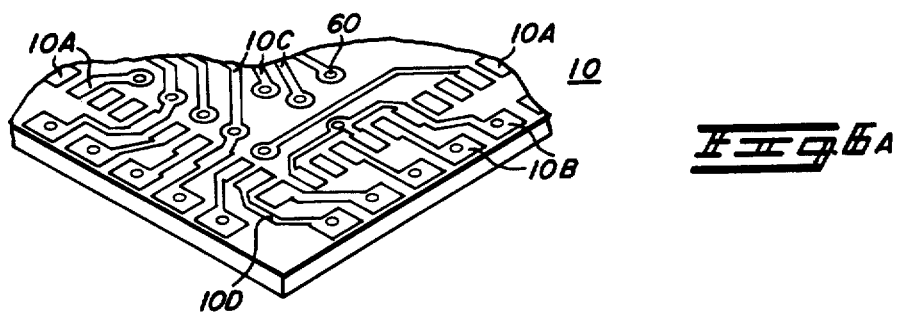
FIGS. 6A and 6B are perspective views of both surfaces of the substrate of the assembly.
Figure 6B:
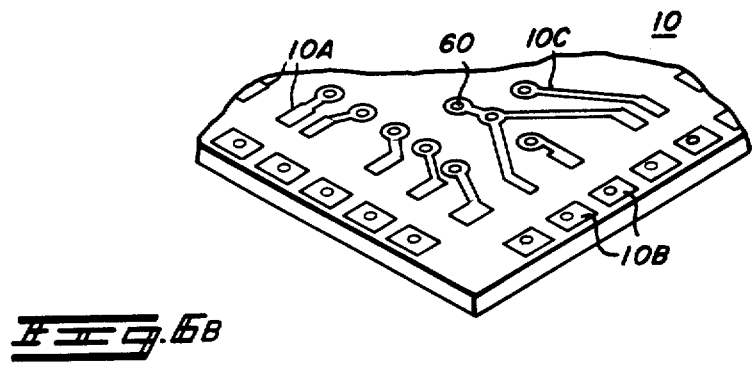

FIGS. 6A and 6B illustrate possible arrangements of the conductive areas 10B, B, C and D on the top and bottom respectively of the substrate 10. Since, in the preferred embodiment, one component on the substrate 10 is a ROM 14 having all its terminals coupled to the other component, the microprocessor 12, interconnections can be made by paths which are completely between the two components and which include conductive vias 60 in the substrate 10. In other words, each interconnection between components 12, 14 can be made by a path including one conductive area 10A and one area 10C on one side of the substrate, one via 60, and areas 10A and 10C on the opposite side of the substrate. Each of the leads 40 is connected to one of the conductive areas 10B which goes, either directly by a conductive path 10D on the top side of the substrate, or by a conductive area 10D on the bottom side, through a via 60 to an area 10A on the top side, to the microprocessor 12. This arrangement of conductive areas has several advantages, among which are shortened interconnect paths and greatly reduced substrate area. The assembly method has the advantage of utilizing automated processes such as reflow soldering and wave soldering or solder bath instead of hand soldering or wire bonding.

Figure 7:
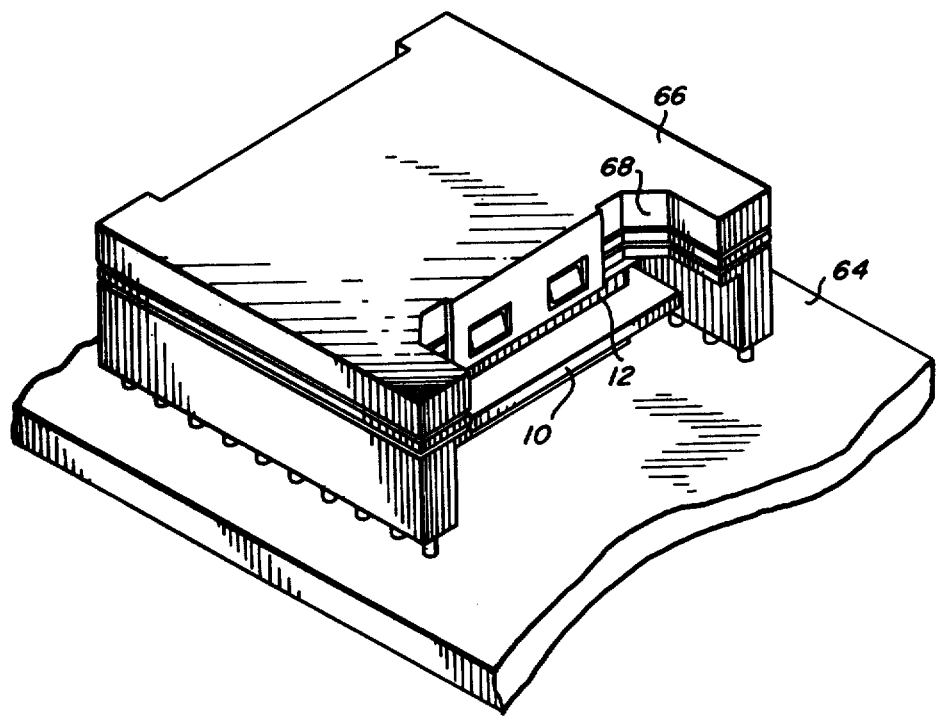
FIG.7 is a perspective view of the completed and installed assembly with the additional component in place.

In FIG. 7 the assembly as described above is shown with the bottom strip 40A removed and the individual leads attached to a chassis or printed circuit board 64. For reasons of clarity in the drawing, no conductive paths are shown on the chassis 64. Above the assembly is another component 66, which is preferably a component whose function is closely interrelated to the function of the components 12, 14. The component 66 has leads along at least two edges and straddles the substrate assembly, with the leads being permanently or releasably attached to the chassis or board 64. In the preferred embodiment, the leads of the component 66 are inserted into miniature pin sockets 67 so that the component 66 may be removed and replaced easily. For example, the component 66 could be or include a "code plug" for a miniature receiving device. Thus, the "address" of the device could be changed merely by replacing the code plug. In such a device, the lead lengths between such components as microprocessor, memories, etc., is often of critical importance. The positioning of the component 66 with minimal lead lengths to the substrate-mounted components is, therefore, of great significance. The component 66 will preferably be of a geometric configuration such that only one insertion orientation is possible. The configuration shown includes a recessed portion 68 into which another associated component (not shown) will project, thus preventing an incorrect insertion of the component 66.

Thus, there has been illustrated and described a method of mounting two complementary electronic components on both sides of one substrate with all or nearly all of the interconnection paths being in the space between the components, on and through the substrate. One fixture positions the three elements for reflow soldering and another fixture protects the two electronic components while allowing automated soldering of leads to the assembly. An additional interrelated component can then be mounted astraddle the substrate assembly with minimal lead lengths to the substrate. Numerous modifications and variations of this invention are possible and it is intended to cover all such as fall within the spirit and scope of the appended claims.

What is claimed is:

1. A double-sided assembly as for electronic apparatus and comprising:

A single insulating substrate having two surfaces with a plurality of conductive paths on each surface and, in at least a central area, a plurality of throughholes with certain of the conductive paths extending through respectives ones of the holes;

a leadless chip carrier smaller in area than the substrate and having conductive areas on a carrier surface, said conductive areas being removably and conductively fused to certain of the conductive paths on one surface of the substrate;

a first electronic component smaller in area than the substrate and having conductive areas on a first component surface, said conductive areas being removably and conductively fused to conductive paths on the other surface of the substrate, said electronic component substantially overlying said leadless chip carrier; and a plurality of leads, each conductively affixed to a respective one of the conductive paths on opposite surfaces of said substrate and adjacent at least one edge of the substrate.

2. An assembly as for electronic apparatus and comprising:

a single insulating substrate having two surfaces with a plurality of conductive paths on each surface and, in at least a central area, a plurality of throughholes with certain of the conductive paths extending through respective ones of the holes;

a leadless chip carrier smaller in area than the substrate and having conductive areas on a carrier surface, said conductive areas being removably and conductively fused to certain of the conductive paths on one surface of the substrate;

a first electronic component smaller in area than the substrate and having conductive areas on a first component surface, said conductive areas being removably and conductively fused to conductive paths on the other surface of the substrate, said first electronic component substantially overlying said leadless chip carrier;

a plurality of leads, each conductively affixed to a respective one of the conductive paths on opposite surfaces of said substrate and adjacent at least one edge of the substrate; and a second electronic component having conductive leads on a least two edges, the second component being position immediately above and conductively coupled to at least one of the leadless chip carrier and first electronic component.

3. An electronic assembly in accordance with claim 1 or claim 2 wherein, said first electronic component is a second leadless chip carrier.

4. An assembly in accordance with claim 3 wherein, said leadless chip carriers are hermetically sealed.

5. An assembly in accordance with claim 3 wherein, said first leadless chip carrier contains a Read Only Memory and said second leadless chip carrier contains a microprocessor.

6. An assembly in accordance with claim 1 or claim 2 wherein, said conductive areas on the leadless chip carrier and the first electronic component are removably and conductively fused to the conductive paths on the surfaces of the insulating substrate by solder.

7. An assembly in accordance with claim 1 or claim 2 wherein, said leads project normal to the plane of said insulating substrate.

8. An assembly in accordance with claim 1 wherein said leadless chip carrier contains a microprocessor and said first electronic component is a leadless chip carrier containing a Read Only Memory, and said second electronic component is a code plug.

9. A double-sided assembly as for electronic apparatus and comprising;
- a single insulating substrate composed primarily of a ceramic material and having two surfaces with a plurality of conductive paths on each surface and, in at least a central area, a plurality of through-holes with certain of the conductive paths extending through respective ones of the through-holes;
- a microprocessor packaged inside a first hermetically sealed leadless chip carrier smaller in area than the substrate and having conductive areas on a first chip carrier surface, said conductive areas being soldered to certain of the conductive paths on one surface of the substrate;
- a Read Only Memory packaged inside a second hermetically sealed leadless chip carrier smaller in area than the substrate and having conductive areas on a second chip carrier surface, said conductive areas being soldered to conductive paths on the other surface of the substrate, said second chip carrier surface substantially overlying said first chip carrier surface; and
- a plurality of leads, each conductively affixed to a respective one of the conductive areas adjacent the edge of said substrate and projecting normal to the plane of said substrate.

10. An assembly as for electronic apparatus and comprising:
- a single insulating substrate composed primarily of a ceramic material and having two surfaces with a plurality of conductive paths on each surface and, in at least a central area, a plurality of through-holes with certain of the conductive paths extending through respective ones of the through-holes;
- a microprocessor packaged inside a first hermetically sealed leadless chip carrier smaller in area than the substrate and having conductive areas on a first chip carrier surface, said conductive areas being soldered to certain of the conductive paths on one surface of the substrate;
- a Read Only Memory packaged inside a second hermetically sealed leadless chip carrier smaller in area than the substrate and having conductive areas on a second chip carrier surface, said conductive areas being soldered to conductive paths on the other surface of the substrate, said second chip carrier surface substantially overlying said first chip carrier surface;
- a plurality of leads, each conductively affixed to a respective one of the conductive areas adjacent the edge of the substrate and projecting normal to the plane of said substrate; and
- a code plug having conductive leads on at least two edges, said code plug being positioned immediately above and conductively coupled to at least the microprocessor.

11. A method of providing a double-sided assembly as for electronic apparatus including the steps of:
- providing an insulating substrate having two surfaces;
- providing through-holes in at least the central portion of the substrate;
- providing a plurality of conductive paths on each surface of the substrate, including at least some paths on one surface of the substrate which continue through the central holes and onto the other surface of the substrate;
- screening solder paste on selected portions of the conductive paths;
- providing a first electronic component which is smaller in area than the substrate, and includes conductive paths terminating on a first component surface thereof;
- providing a first fixture element having a first cavity for receiving and supporting the first electronic component, and a second cavity above the first cavity for receiving and supporting the substrate;
- placing the first electronic component in the first cavity with the first component surface upward;
- positioning the substrate in the second cavity;
- providing a second electronic component which is smaller in area than the substrate and has conductive paths terminating on a second component surface thereof;
- providing a second fixture element having a window therein for receiving the second electronic component;
- positioning the second fixture element on the first fixture element;
- placing the second electronic component in the window of the second fixture element with second component surface downward, completing a first assembly;
- subjecting the completed first assembly to a temperature sufficient to reflow solder the conductive paths of the first and second components to the conductive paths of the substrate;
- removing the soldered elements from the fixture;
- mechanically attaching at least one lead frame to at least one edge of the substrate and in contact with some of the conductive paths;
- providing a third fixture having sections which enclose the portion of the substrate bearing the two electronic components and expose the substrate portion bearing the lead frame;
- positioning the reflow soldered assembly in the third fixture element; and
- subjecting a portion of the fixture and assembly to flux and molten solder.

12. A method in accordance with claim 1 wherein each of the conductive paths on a predetermined one of the substrate surfaces continues to a path on the other substrate surface.

13. A method in accordance with claim 11 wherein the component on a predetermined substrate surface is an auxiliary to a primary one of said components, and all conductive paths on the auxiliary component are coupled through central holes to the conductive paths on the primary component.

14. A method in accordance with claim 11 and including the step of providing an insulating layer over at least the conductive areas in the central portions of the substrate before the components are affixed.

* * * * *